(12) United States Patent
Hayashi

(10) Patent No.: US 6,394,665 B1
(45) Date of Patent: May 28, 2002

(54) SEMICONDUCTOR LASER MODULE

(75) Inventor: Hideki Hayashi, Kanagawa (JP)

(73) Assignee: Sumitomo Electric Industries, Ltd., Osaka (JP)

(*) Notice: Subject to any disclaimer, the term of this patent is extended or adjusted under 35 U.S.C. 154(b) by 29 days.

(21) Appl. No.: 09/589,773

(22) Filed: Jun. 9, 2000

(30) Foreign Application Priority Data

Jun. 10, 1999 (JP) .......................................... 11-164522

(51) Int. Cl.[7] ................................................. G02B 6/42
(52) U.S. Cl. .............................. 385/88; 385/37; 385/90; 385/92
(58) Field of Search .............................. 385/88, 90, 91, 385/92, 37

(56) References Cited

U.S. PATENT DOCUMENTS

| 5,717,804 A | * | 2/1998 | Pan et al. ...................... 385/94 |
|---|---|---|---|
| 5,832,011 A | | 11/1998 | Kashyap ....................... 372/23 |
| 5,845,030 A | | 12/1998 | Sasaki et al. |
| 5,859,945 A | | 1/1999 | Kato et al. |
| 5,993,073 A | | 11/1999 | Hamakawa et al. |
| 6,181,718 B1 | * | 1/2001 | Kobayashi et al. ........... 372/34 |
| 6,236,477 B1 | * | 5/2001 | Ishihara et al. ............... 359/40 |

* cited by examiner

Primary Examiner—John D. Lee
Assistant Examiner—Jennifer Doan
(74) Attorney, Agent, or Firm—Smith, Gambrell & Russell, LLP

(57) ABSTRACT

A semiconductor laser module includes a light-emitting element, an optical resonator having a pair of opposed reflectors for mutually reflecting the light emitted from the light-emitting element, and an optical fiber for leading out the laser light generated by the light-emitting element. The semiconductor laser module is used as a light source in a wavelength multiplex communication system. The light-emitting element is contained in a package. One of the reflectors of the optical resonator is a reflective film formed on one edge face of the light-emitting element and the other reflector is a diffraction grating formed close to the end portion of the optical fiber.

9 Claims, 4 Drawing Sheets

SEMICONDUCTOR LASER MODULE

BACKGROUND OF THE INVENTION

1. Field of the Invention

The present invention relates to a semiconductor laser module for a wavelength divisional multiplex (WDM) system. More particularly, the invention relates to a semiconductor laser module capable of accurately materializing a desired oscillation wavelength and fit for WDM system.

2. Description of the Related Art

A semiconductor laser module has a semiconductor optical amplifier in combination with an optical fiber for propagating the laser light generated by the semiconductor optical amplifier efficiently depending on the application. Further, the semiconductor optical amplifier essentially consists of a light-emitting element as a light source, and an optical resonator including a pair of reflectors for mutually reflecting the light emitted from the light-emitting element.

FIG. 4 is a diagram illustrating the structure of a typical semiconductor laser module. As shown in FIG. 4, a semiconductor laser 35 is packaged on a base 30 via a sub-mount 31 in the ordinary semiconductor laser module. One side of the base 30 has a perpendicular edge face and an optical system 32 is attached thereto as shown in FIG. 4. Further, a ferrule 21 holding the optical fiber 20 is securely passed through a through-hole provided in the side wall of the package 10. The edge face of the optical fiber 20 is so arranged as to face the semiconductor laser 35 via the optical system 32, so that the light emitted from the semiconductor laser 35 is efficiently coupled to the optical fiber 20.

Further, a series of functional members mentioned above is normally housed in the package 10 in such a state that the functional members are orderly mounted on temperature control elements such as Peltier effect elements 34. The functional members are also made to keep the operating temperature constant under feedback control using a temperature detection element (not shown) that is mounted on the sub-mount 31 together with the semiconductor laser 35.

With the progress of information processing technology now, it is clearly demanded that the transmission density be improved even in the optical information communication field using semiconductor laser modules. The reason for this is that an amount of information to be transmitted has increased to an extremely greater extent in addition to expansion of a field of utilization.

In order to satisfy the above demand, a WDM system is now in progress. In other words, the WDM system allows the transmission speed to be practically improved by superposing a plurality of optical signals having different wavelengths and transmitting the optical signals thus superposed through one light transmission line.

FIG. 5 is a conceptual diagram illustrating a WDM system configuration.

A system shown in FIG. 5 includes a plurality of light sources 101, a mixer 103, a branching device 104 and a plurality of receivers 105. The plurality of light sources 101 each have discrete wavelengths λ1, λ2 ... λn. The mixer 103 injects the light signals emitted from the light sources 101 into a light transmission line 102. The branching device 104 separates the light signals propagated through the light transmission line 102 on a wavelength basis. The plurality of receivers 105 receive the respective light signals thus separated by the branching device 104.

As the above, The light sources 101 in the WDM system each have the discrete wavelengths. In the case of a 1.55 μm band, for example, it has been standardized to use 32 wavelengths increasing at 0.8 nm intervals from 1535.8 nm as shown in the following table 1.

TABLE 1

| Channel | Wavelength |
| --- | --- |
| 1 | 1535.8 |
| 2 | 1536.6 |
| 3 | 1537.4 |
| 4 | 1538.2 |
| 5 | 1539.0 |
| 6 | 1539.8 |
| 7 | 1540.6 |
| 8 | 1541.4 |
| 9 | 1542.1 |
| 10 | 1542.9 |
| 11 | 1543.7 |
| 12 | 1544.5 |
| 13 | 1545.3 |
| 14 | 1546.1 |
| 15 | 1546.9 |
| 16 | 1547.7 |
| 17 | 1548.5 |
| 18 | 1549.3 |
| 19 | 1550.1 |
| 20 | 1550.9 |
| 21 | 1551.7 |
| 22 | 1552.5 |
| 23 | 1553.3 |
| 24 | 1554.1 |
| 25 | 1554.9 |
| 26 | 1555.8 |
| 27 | 1556.6 |
| 28 | 1557.4 |
| 29 | 1558.2 |
| 30 | 1559.0 |
| 31 | 1559.8 |
| 32 | 1560.6 |

When it is attempted to obtain the plurality of oscillation wavelengths at the narrow intervals mentioned above, the light sources are required to have monochromatism and stability. Hence, no satisfactory characteristics are available from a method of directly utilizing the oscillation wavelength of a Fabry-Pérot type semiconductor laser with both edge faces of a semiconductor chip as mirrors of the resonator. Consequently, it has been proposed to obtain desired characteristics by incorporating a diffraction grating into the semiconductor laser element to make a DFB (distribute feedback) or DBR(distributed Bragg reflector) laser.

In the DFB or DBR laser, the oscillation wavelength is determined by the diffraction wavelength of the diffraction grating formed within the semiconductor laser and the gain of the active layer. In other words, as shown in FIG. 6, the reflection spectrum A of the diffraction grating, the longitudinal mode B of the optical resonator including the diffraction grating, and the gain C of the semiconductor optical amplifier have respectively different characteristics. Accordingly, laser oscillation is produced at a wavelength where the product of these characteristics is maximized.

Further, by sufficiently sharpening the reflection spectrum A of the diffraction wavelength of the diffraction grating, the diffraction wavelength becomes actually a substantial oscillation wavelength as shown in FIG. 7. Today, the oscillation spectrum width of the DFB laser has reached GHz order and this can be utilized satisfactorily for the WDM system in view of sharpening the spectrum.

As stated above, the characteristics of the diffraction grating that substantially determine the oscillation wavelength are determined in the laser manufacturing process. It is consequently hard to manufacture semiconductor lasers having specific oscillation wavelengths at narrow intervals conforming to the standards shown in Table 1.

As the diffraction grating is incorporated in the semiconductor laser, the diffraction grating will be directly affected by the temperature characteristics of the semiconductor, and the oscillation wavelength may vary with the environmental temperature change and the heat generation of the semiconductor laser itself. Although the oscillation wavelength changes slightly, it cannot be disregarded for the WDM system using the plurality of light sources with different wavelengths at 0.8 nm intervals.

SUMMARY OF THE INVENTION

An object of the present invention is to provide a novel semiconductor laser module having different oscillation wavelengths at slight intervals.

A semiconductor laser module according to the invention comprises a light-emitting element emitting light, a package, an optical resonator and an optical fiber. The package houses the light-emitting element therein. The optical resonator has a pair of opposed reflectors for reflecting the light emitted from the light-emitting element. The optical fiber leads out laser light generated in the light-emitting element through the optical resonator. The optical fiber has a diffraction grating disposed close to an end portion of the optical fiber. One of the reflectors of the optical resonator is a reflective film formed on one edge face of the light-emitting element and the other reflector thereof is the diffraction grating disposed close to the end portion of the optical fiber.

The above-mentioned semiconductor laser module preferably comprises an optical connector attached to the end portion of the optical fiber, wherein the optical fiber is connected to the package via the optical connector. In the semiconductor laser module, it is advantageous that the optical connector resiliently supports the optical fiber therein and wherein when the optical connector is attached to the package, the optical fiber is abutted against the package so as to be automatically positioned.

A semiconductor laser module according to the invention features that an optical fiber is provided with part of an optical resonator, that is a diffraction grating, and by properly selecting the optical fiber provided with a diffraction grating, the optical fiber thus selected is allowed to incorporate an optical amplifier contained in a package.

The structure of a semiconductor optical amplifier according to the invention is basically similar to that of a Fabry-Pérot type semiconductor laser element. More specifically, its reflectance is lowered as much as possible by forming an extremely low reflective film on the emission-side edge face of the semiconductor optical amplifier. As any optical resonator is not formed in a single semiconductor optical amplifier, no laser oscillation is generated in that single body.

The oscillation wavelength in the semiconductor laser module is generally determined by the diffraction wavelength spectrum of the diffraction grating forming the optical resonator and the gain characteristics within the semiconductor optical amplifier. In this case, the semiconductor laser module can be oscillated with this diffraction wavelength by sufficiently sharpening the diffraction spectrum. Moreover, half width of oscillation wavelength is almost similar to what is available from the DFB or DBR laser.

Further, in the above-mentioned semiconductor laser module according to the invention, fiber grating (hereinafter called the "FG") formed in the optical fiber is used as the diffraction grating. The diffraction wavelength of the FG can be determined entirely differently from the manufacturing process of semiconductor optical amplifiers. The well controlled FG can be produced superior to that in the case where diffraction grating to be formed in the semiconductor optical amplifier. The FG is also less affected by the ambient temperature during the operation. Moreover, the optical fiber that is usually made of glass will never generate heat itself. Therefore, the semiconductor laser module is allowed to easily select an oscillation wavelength.

Moreover, in the above-mentioned semiconductor laser module according to the invention, it is preferable that an optical connector is fitted to the optical fiber formed with the FG and is attached to the package of the semiconductor optical amplifier. With this arrangement, the FG becomes easily replaceable, so that a semiconductor laser module having a desired oscillation wavelength can be supplied.

Although a specific example of the invention will now be described with reference to the drawings, the description thereof refers to only an embodiment of the invention and never limits the technical scope thereof.

DESCRIPTION OF THE PREFERRED EMBODIMENTS

Figure 1:
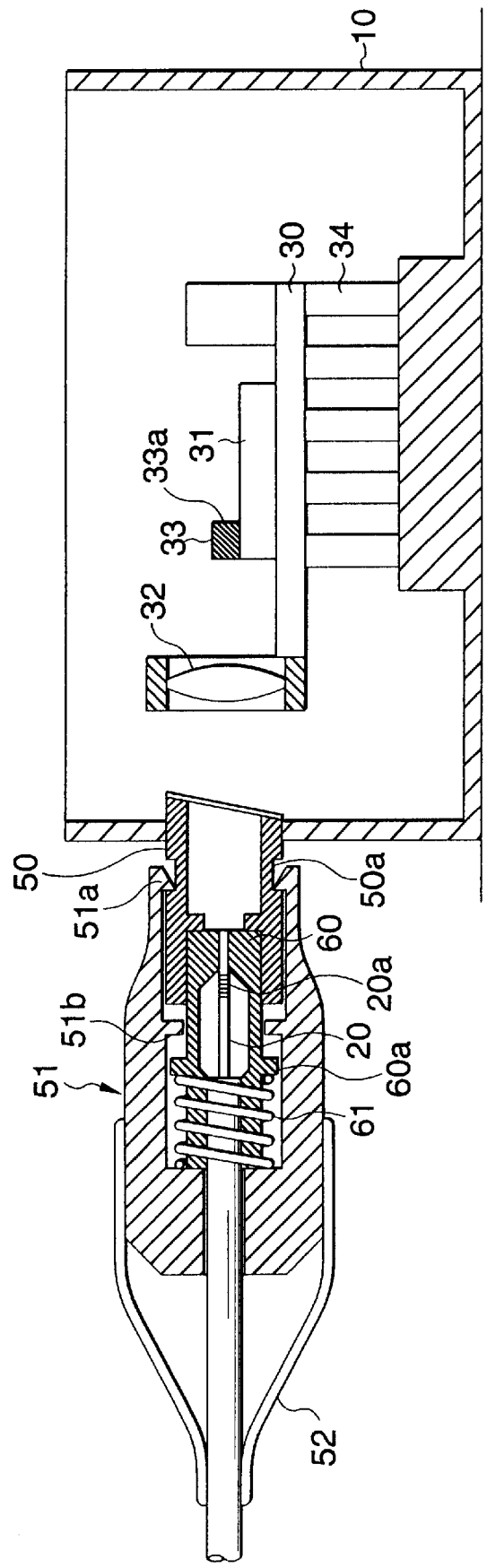
FIG. 1 is a sectional view of an embodiment of semiconductor laser module according to the invention.

FIG. 1 is a sectional view of an embodiment of semiconductor laser module according to the invention.

Figure 4:
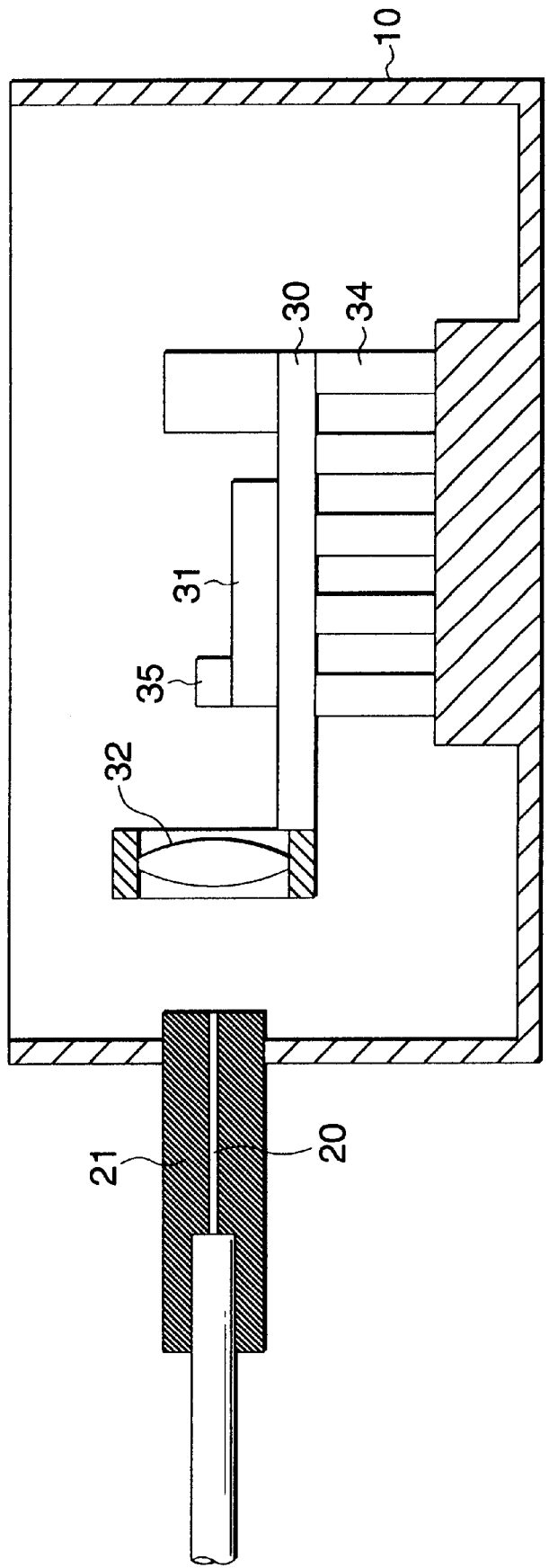
FIG. 4 is a sectional view illustrating the structure of a typical conventional semiconductor laser module.
Figure 5:
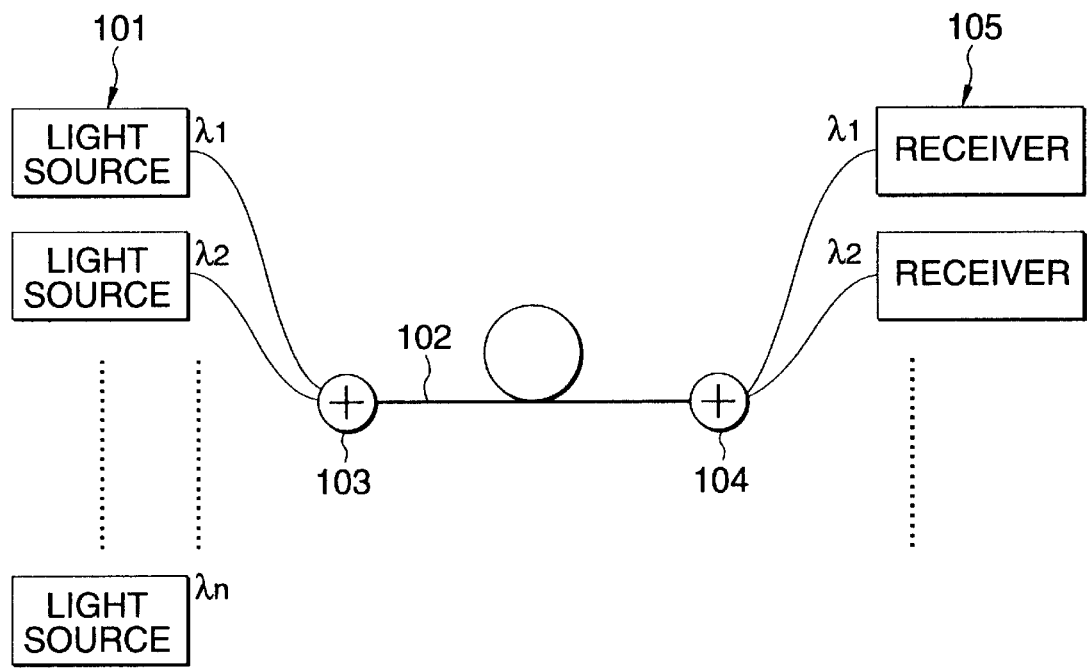
FIG. 5 is a conceptual diagram illustrating the basic concept of a wavelength multiplex communication system.
Figure 6:
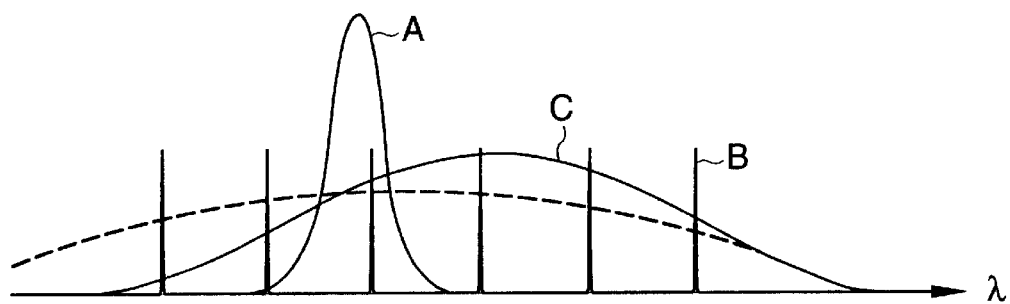
FIG. 6 is a graph showing the process of determining oscillation wavelength in a semiconductor laser module.
Figure 7:
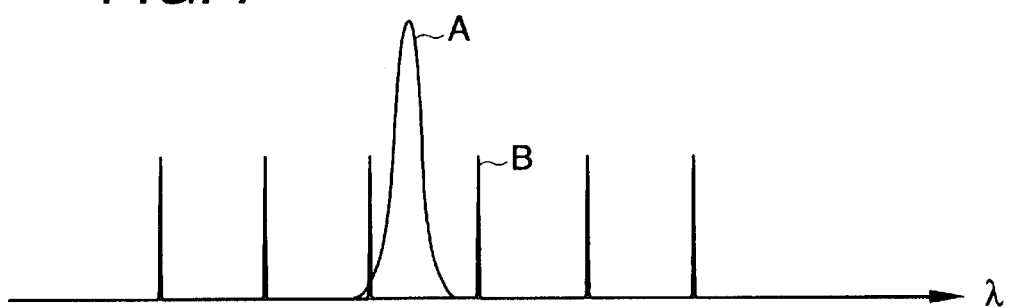
FIG. 7 is a graph practically showing the process of determining oscillation wavelength in a semiconductor laser module.

In FIG. 1, reference numerals designate like and corresponding component parts in FIG. 4. A Peltier effect element 34, and optical fiber 32 and the like are arranged in a package 10 in the substantially same way as in any conventional semiconductor laser module. However, a difference from the conventional semiconductor laser module lies in the fact that a semiconductor optical amplifier 33 is mounted on a sub-mount 31.

The structure of a semiconductor optical amplifier 33 is basically similar to that of a Fabry-Pérot type semiconductor laser element. One edge face of the semiconductor optical amplifier 33, a reflective film 33a is formed. The other edge face thereof, an extremely low reflective film is formed. The extremely low reflective film, for example, has a reflectance of not more than 1%.

On the other hand, as shown in FIG. 4, the method of mounting the optical fiber 20 is entirely different from the prior art one applied to the conventional semiconductor laser module; that is, a substantially cylindrical receptacle 50 is fixedly secured to the side wall of the package 10. Moreover, an optical connector 51 is fitted to the end portion of the optical fiber 20, which is coupled to the semiconductor optical amplifier 33 by fitting the optical connector 51 to the receptacle 50. Incidentally, a FG 20a is formed close to incident end of the optical fiber 20 as shown in FIG. 1. This diffraction grating 20a and the reflective film 33a form an optical resonator.

Figure 2:
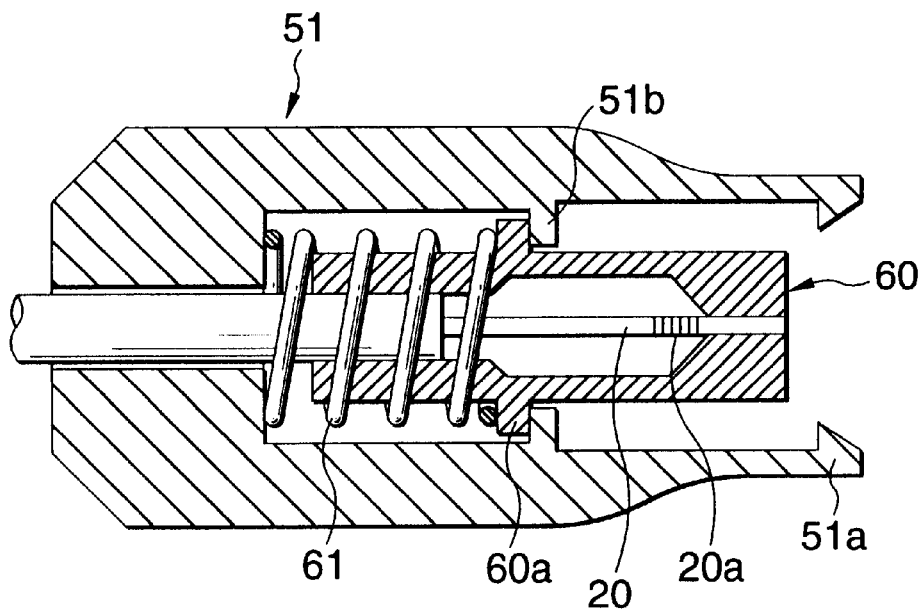
FIG. 2 is a sectional view of an optical connector fit for use in the semiconductor laser module shown in FIG. 1.

FIG. 2 is an enlarged sectional view of the optical connector 51 shown in FIG. 1.

As shown in FIG. 2, the optical connector essentially consists of an optical connector body 51, and a ferrule 60 contained therein. In this case, the inside of the optical connector body 51 is wide enough to contain the ferrule 60. The optical connector body 51 has a cavity with one end opened. The opening side of the optical connector body 51 is extended so as to resiliently support a pair of hooks 51a. Moreover, a flange 51b projecting inward is formed within the cavity, whereas a collar flange 60a is formed on the side of the ferrule 60 contained in the cavity. The ferrule 60 is urged outside by a spring 61 fitted between the base of the cavity and the flange 60a. However, the ferrule 60 remains in the connector body 51 as the flange 60a of the ferrule 60 is brought into contact with the flange 51b of the connector body 51.

Figure 3:
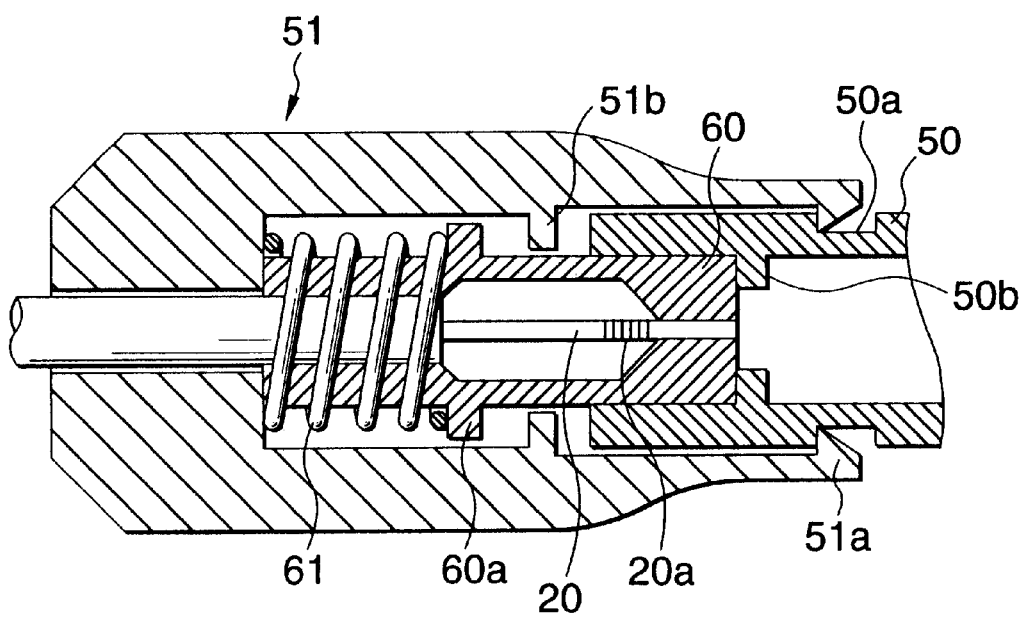
FIG. 3 is a sectional view illustrating the function of the optical connector shown in FIG. 2.

FIG. 3 is a sectional view when the optical connector 51 thus constructed is fitted to the receptacle 50. In FIG. 3, reference numerals designate like and corresponding component parts in FIGS. 1 and 2.

As shown in FIG. 3, the receptacle 50 is basically cylindrical and has an internal flange 50b projecting inward and the groove 50a on its outer peripheral face. When the optical connector 51 is inserted into the receptacle 50, the front edge face of the ferrule 60 is first brought into contact with the flange 50b of the receptacle 50. When the optical connector 51 is further forced in, the spring 61 is compressed while the ferrule 60 remains in that position, that is, the spring 61 is compressed while the ferrule 60 is brought into contact with the flange 50b. Ultimately, the hook 51a of the optical connector 51 enters the groove 50a of the receptacle 50. When the optical connector 51 is released in this state, it is pulled back by the spring 61 and the hook 51a engages to the groove 50a as shown in FIG. 3.

The optical connector 51 thus structured is easily fixed by pressing it against the receptacle 50. As the ferrule 60 is so arranged that it is brought into direct contact with the flange 50b of the receptacle 50 for positioning purposes, the optical fiber 20 and the optical system 32 in the semiconductor laser module can accurately be positioned automatically.

Although the coupling of the optical connector is easily releasable by opening the hook 51a of the optical connector 51 according to this embodiment, it is still preferred to make the user unable to remove the optical connector 51 easily in view of product quality. The rear end of the optical connector 51 may preferably be sealed with a cap 52, for example, as shown in FIG. 1.

Semiconductor laser modules thus utilizing the optical connectors may be manufactured in such a manner that the package and the optical connector are separately produced beforehand, and these members are combined into a semiconductor laser module depending on the application, so that the semiconductor laser module can have a desired oscillation wavelength.

As set forth above in detail, the semiconductor laser module produced according to the invention has part of the optical resonator formed with FG formed in the optical fiber. As the oscillation wavelength of the semiconductor laser module is strongly dependent on the characteristics of FG, a semiconductor laser module having a desired oscillation wavelength can be supplied with efficiency by properly setting the characteristics of FG.

What is claimed is:

1. A semiconductor laser module for a light source in an optical communication system, said semiconductor laser module comprising:

a light-emitting element for emitting light, the light-emitting element having a light-reflecting surface and a light-transmitting surface;

a package for housing said light-emitting element therein;

an optical fiber having a diffraction grating disposed close to an end portion thereof and opposing the light-transmitting surface of the light-emitting element; and an optical connector, which removably attaches the end portion of said optical fiber to the package that houses the light-emitting element therein, wherein the diffraction grating and the light-refracting surface comprise an optical resonator of the module.

2. The semiconductor laser module as claimed in claim 1, wherein the optical fiber is removably attached to a substantially cylindrical receptacle of the package via the optical connector.

3. The semiconductor laser module as claimed in claim 2, wherein the optical fiber is resiliently supported by the optical connector therein, and is abutted to the substantially cylindrical receptacle of the package so as to be automatically positioned when the optical connector is removably attached to the package.

4. The semiconductor laser module as claimed in claim 1, wherein a substantially nonreflective film is formed on the light-transmitting surface of the light-emitting element.

5. The semiconductor laser module as claimed in claim 1, wherein the diffraction grating is a fiber grating having a periodic refractive index distribution.

6. The semiconductor laser module as claimed in claim 1, wherein the substantially cylindrical-shaped receptacle is attached to a side wall of the package, and wherein the optical fiber is held by a ferrule resiliently disposed within the optical connector, and is removably connected to the package by contacting the ferrule of the optical connector with the receptacle.

7. The semiconductor laser module as claimed in claim 6, wherein the optical fiber is resiliently supported by the ferrule of the optical connector therein, and is abutted to the receptacle upon connecting so as to be automatically positioned when the optical connector is removably attached to the receptacle.

8. The semiconductor laser module as claimed in claim 7, wherein the receptacle has a flange member projecting inward thereof, and the ferrule has an end face, the flange member being brought into contact with the end face of the ferrule when the optical connector is removably attached to the receptacle.

9. The semiconductor laser module as claimed in claim 8, wherein the receptacle has a groove on its outer peripheral surface, and the optical connector has an elastically deformable hook to be coupled with the groove to thereby removably attach the optical connector to the package.

* * * * *